(12) United States Patent
Yamada

(10) Patent No.: US 7,042,017 B2
(45) Date of Patent: May 9, 2006

(54) LIGHT EMITTING DEVICE

(75) Inventor: Motokazu Yamada, Tokushima (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/448,299

(22) Filed: May 30, 2003

(65) Prior Publication Data

US 2003/0209704 A1    Nov. 13, 2003

Related U.S. Application Data

(62) Division of application No. 09/400,432, filed on Sep. 21, 1999, now Pat. No. 6,608,330.

(30) Foreign Application Priority Data

Sep. 19, 1998 (JP) ............................. P 10-267028
May 7, 1999 (JP) ............................. P 11-127178

(51) Int. Cl.
*H01L 33/00* (2006.01)

(52) U.S. Cl. ......................................... 257/97; 257/13
(58) Field of Classification Search ................. 257/97, 257/13
See application file for complete search history.

(56) References Cited

U.S. PATENT DOCUMENTS 5,684,309 A    11/1997    McIntosh et al.

FOREIGN PATENT DOCUMENTS

| JP | 09-232627 | 9/1997 |
| JP | 10-012969 | 1/1998 |
| JP | A 10-022525 | 1/1998 |
| JP | 10-084132 | 3/1998 |
| JP | 10-215029 | 8/1998 |

OTHER PUBLICATIONS

Shuji Nakamura et al., "High-Brightness InGaN Blue, Green and Yellow Light-Emitting Diodes with Quantum Well Structures"; Jpn. J. Appl. Phys. vol. 34 (1995) pp.L797-L799, Part 2, No. 7A, Jul. 1, 1995.

*Primary Examiner*—Jerome Jackson
(74) *Attorney, Agent, or Firm*—Volentine Francos & Whitt, PLLC

(57) ABSTRACT

A light emitting device includes an active layer, having a multiple quantum well structure, sandwiched between an n-type semiconductor layer and a p-type semiconductor layer. The active layer includes first and second well layers made of a nitride compound semiconductor containing In, where the second well layer emits light having a main peak wavelength which is longer than that of the first well layer, and where the growth number of the first well layer is more than the growth number of the second well layer.

14 Claims, 7 Drawing Sheets

BEAM SPECTRUM OF EXAMPLE 1 (nm)

BEAM SPECTRUM OF EXAMPLE 5 (nm)

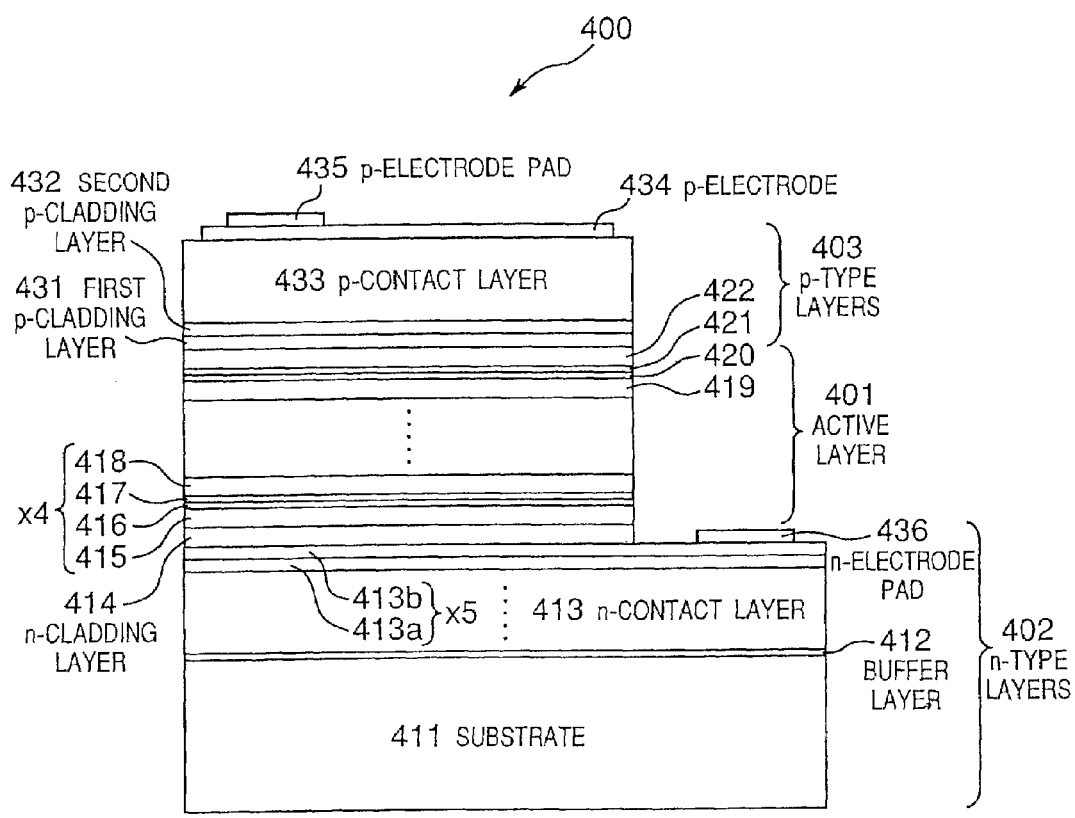

LIGHT EMITTING DEVICE

CROSS-REFERENCE TO RELATED APPLICATIONS

This is a divisional of and claims priority to U.S. patent application Ser. No. 09/400,432, filed Sep. 21, 1999, now U.S. Pat. No. 6,608,330, the contents of which are incorporated herein by reference. Also, a claim of priority is made to Japanese patent application No. 10-267028, filed Sep. 21, 1998, and to Japanese patent application No. 11-127178, filed May 7, 1999.

BACKGROUND OF THE INVENTION

1. Field of the Invention

This invention relates to a light emitting device made of nitride compound semiconductor of III–V group (in general, expressed in a formula of $In_xAl_yGa_{1-X-Y}N$, wherein $0<X$, $0 \leq Y$, $X+Y \leq 1$). And especially it relates to a light emitting device including an active layer depositing at least two kind of well layers emitting different colors of light and mixing colors thereby emitting light of another color such as white with a desired color rendering property.

2. Description of Related Art

Since light emitting devices which emit light of red, green, and blue color (so-called RGB) with quite strong intensity have been developed so far, RGB light emitting devices of high luminous intensity type are now manufactured and available. It is noted that the color of light emitted by the nitride compound semiconductor device can be varied from ultraviolet region through red region, by adjusting the composition ratio thereof.

Meanwhile, because of excellent characteristics of the light emitting devices such as high luminous intensity, downsizing, and high credibility, applications thereof have been rapidly expanding in the technical fields, for example, for light sources for indicators mounted on automobiles, light sources for backlights of liquid crystal displays, and other luminaires.

In those applications, especially since white light emitting devices are easiest and most comfortable to human eyes, such white light emitting devices are highly desired. There are basically two approaches to obtain such white light. Three of RGB or two of blue and yellow (that is complementary color of blue) color light emitting diode chips are mounted on a same stem to mix them to produce the white light. Alternatively fluorescer emitting fluorescent yellow light when absorbing blue light are applied on the blue color emitting diode chips to produce white light.

However those approaches to achieve white light have some problems. When mounting a plurality of light emitting diode chips on the same stem to produce white light, those chips have to be disposed as closely as possible each other in order to improve a color mixing property. (The color mixing property is referred herein denote the extent to which the light from the device can be evenly seen as single white light.) But the finite sizes of the chips limit the improvement. Further when utilizing chips of different semiconductor based materials, they have different forward voltages and distinct characteristics dependent upon the temperature.

Also when utilizing fluorescer to produce the white light, a step for applying fluorescer on the chip is required, which is a complicated step. Further when combining the blue light emitting chip and fluorescer emitting fluorescent yellow light by absorbing the blue light to obtain white light, the luminous efficiency is theoretically reduced, in comparison with the combination of a plurality of different color chips.

Therefore those conventional approaches are not yet satisfactory to replace the current light sources with the semiconductor light emitting devices, and it is desired to provide the light emitting devices with higher luminous efficiency and higher luminous intensity that are capable of emitting white light. This invention is directed to providing such a light emitting device which can emit white light by itself.

SUMMARY OF THE INVENTION

The first object of the present invention is to provide a light emitting device including at least two well layers made of nitride compound semiconductor emitting different color light due to different In composition ratios to so that white light can be obtained by mixing the different color light.

The second object of the present invention is to provide a light emitting device including at least one of first and second well layers where the second well layer has rougher surface than that of the first well layer to improve a luminous efficiency.

The third object of the present invention is to provide a light emitting device further including a first barrier layer containing Al and second barrier layer substantially not containing Al, which are formed on each well layer to reduce the forward voltage thereby improve the luminous efficiency.

The light emitting device according to an aspect of the present invention, comprises an active layer of a multiple quantum well structure, sandwiched between an n-type semiconductor layer and a p-type semiconductor layer; the active layer including, at least one of first well layers made of nitride compound semiconductor containing In, and at least one of second well layers made of nitride compound semiconductor containing In, the second well layer emitting light having a main peak wavelength longer than that of the first well layer.

When the main peak wavelength of the first and second well layers are selected such that they are complementary colors each other, and thus a white color light can be obtained by mixing the two color lights.

The light emitting device according to another aspect of the present invention, is characterized in that the second well layer is disposed between the first well layer and the p-type semiconductor layer.

In general, it is very difficult to grow the nitride compound semiconductor containing In. As the In composition ratio within the well layer is higher, the light emitted by the well layer has a longer wavelength and its crystallinity is worse so that the luminous efficiency is also reduced. This property is remarkable when the In composition ratio is not less than 0.05. In fact, the diffusion length of the hole is very short within the nitride compound semiconductor of quantum well structure. Therefore it is preferable to deposit the second well layer adjacent to the p-type semiconductor layer that provide hole because the second well layer has less the luminous efficiency due to the more In composition ratio and worse crystallinity. In other words, this is because the hole-electron recombination possibility near the p-type semiconductor layer is higher than that far from the p-type semiconductor layer. Thus the luminous efficiency of the device can be improved by depositing the second well layer between the first well layer and the p-type semiconductor layer.

The light emitting device according to another aspect of the present invention, is characterized in that growth numbers of the first and second well layers are adjusted to control the luminous intensity ratio of light emitted by the first well layer over light emitted by the second well layer. Thus a desired color rendering property can be obtained. (The color rendering property is referred herein as to one of the effects of a light source under which an object can be seen.)

So far, most of light sources rather than light emitting semiconductor devices have been also developed to realize many kinds of color rendering property. For instance there are many types of fluorescent lamps illuminating with white light of different nuance. Therefore the light emitting device according to the present invention is desired to easily adjust its color rendering property to replace the conventional light sources.

According to the present invention, its color rendering property, in other words, the ratio of luminous intensity emitted by each well layer is adjusted by controlling the ratio of the growth numbers of the first and second well layers. Rather than this approach, as shown in Japanese Laid-Open publication 10-22525, the ratio of luminous intensity emitted by each well layer can be adjusted by controlling thickness of each well layer. However it has a problem. When its active layer is made of quantum well structure, as the well layer is thinner, although the luminous intensity is stronger to some extent, the peak wavelength shifts to shorter side due to the quantum size effect. Meanwhile as the well layer is thicker, although the luminous intensity is weaker to some extent, the peak wavelength shifts to longer side. That is to say, it is difficult to achieve light having the just desired peak wavelength.

The light emitting device according to another aspect of the present invention, is characterized in that the device further comprising a plurality of barrier layers sandwiching said first and second well layers; wherein thickness of said first and second well layers are adjusted to control a luminous intensity ratio of light emitted by said first well layer over light emitted by said second well layer thereby obtaining the device having a desired color rendering property.

As mentioned above, its color rendering property (nuance of the light source), in other words, the ratio of luminous intensity emitted by each well layer can be adjusted by controlling not only the ratio of the growth numbers but also the thickness of the first and second well layers.

The light emitting device according to another aspect of the present invention, is characterized in that the growth number of the first well layer is more than that of the second well layer.

Especially when the second well layer is disposed between the first well layer and the p-type semiconductor layer, light emitted by the first well layer is absorbed in the second well layer so that its luminous intensity of the first well layer is reduced. Therefore the light emitting device with desired color rendering property can be easily obtained by depositing the first well layers more times than the second well layer.

The light emitting device according to another aspect of the present invention, is characterized in that a light spectrum emitted by the first well layer has a half-width narrower than that emitted by the second well layer.

When the device includes the first well layer emitting light having main wavelength in the blue region and the second well layer emitting light having main wavelength in the yellow region, the mixed light doesn't often show a good color rendering property because it includes no or little light in the green and red region. Therefore it is preferable that the beam spectrum emitted by the second well layer is broader than that of the first well layer. Thus the general color rendering index Ra of light emitted by the device can be improved without reducing the luminous efficiency, that is, the light emitting device with high luminous intensity and high color rendering property can be obtained. It would be understood by the persons skilled in the art that the half-width of the light spectrum can be controlled, for instance, by adjusting the crystallinity of the well layers or adding impurity therein.

The light emitting device according to another aspect of the present invention, is characterized in that the growth number of the first well layer falls within the range of 2 through 10, and the growth number of the second well layer falls within the range of 1 through 3.

The light emitting device according to another aspect of the present invention, is characterized in that the main peak wavelength of the first well layer falls within the range of 450 through 500 nm, and the main peak wavelength of the second well layer falls within the range of 560 through 670 nm.

The light emitting device according to another aspect of the present invention, is characterized in that each of growth surfaces of said first well layers is rougher than that of each of said second well layer.

In general, it has been understood that where the light emitting device has the well layer of the multiple quantum well structure, which has smoother growth surfaces (flatter composition face with barrier layer) and better crystallinity, then its luminous efficiency is improved. However the inventor of the present invention found that it is not always true, especially in case where there may be a certain interactive effect between the first and second well layers adjoining over the barrier layer. Thus the present inventor has firstly recognized that in the case of that the degree of asperity of the second well layer emitting the longer wavelength light is greater than that of the first well layer emitting the shorter wavelength light, the shorter wavelength light from the first well layer is less absorbed in the second well layer. Moreover the inventor has found that under this condition, the degree of asperity of the second well layer can be optimized as explained below to improve the luminous efficiency of the second well layer also, thereby improving the luminous efficiency of the light emitting device in total.

Now an example how to compare the degree of the asperity of the first and second well layers is described hereinafter.

Cutting down the light emitting device in the direction perpendicular to the layer thickness, the degree of asperity of the composition faces between the well layers and barrier layer can be observed and compared in the cross section through a scanning electron microscope. The difference of degree of asperity or roughness of the first and second well layers is often distinguished by observing through the microscope. But in the case where such difference is not clear, the degrees of asperity may be compared by measuring the index R which will be described hereinafter. Alternatively in the manufacturing process of the device, the degree of asperity may be measured by using a GIXR (Grazing Incidence X-Ray Reflection) method for at least one of the upper and lower surfaces. Where there are plural of the first and/or second well layers, at least one of the second well layer has greater degree of asperity than that of at least one of the first well layer. But preferably all of the second well layers have a greater degree of asperity than that of all of the first well layers. It is noted that even in the case where there are plural of the first and/or second well layers, since the crystallinity and the growth configuration of the well layers depends mainly upon the In composition ratio, each of the first and second well layers has the almost same degree of asperity.

Further forming the second well layer having greater degree of asperity than that of the first well layer is preferable in the view point of the crystallinity of the second well layer. That is to say, in the case where the second well layer has greater degree of asperity than that of the first well layer (including the case where only the second well layer has asperity), the crystallinity of the second well layer is much worse than that in the case where the first well layer has greater degree of asperity than that of the second well layer. In the later case, it is difficult to grow the second well layer which has even thickness in some particular portions across the wafer, and to be worse, the second well layer may not be grown in some region at all. On the contrary, where the second well layer has greater degree of asperity than that of the first well layer, the second well layer can be grown having comparatively even thickness. Therefore it is understood that the characteristics of the light emitting device is improved by making the degree of asperity of the second well layer greater than that of the first well layer. Such grown device, as indicated above, has the first and second well layers both having good crystallinity and even thickness. Consequently, the ratio of the luminous intensity emitted by the first and second well layers is kept constant, that leads an improvement in minimizing diversity of the luminous intensity and luminous nuance between each device.

As it is clearly understood by the persons skilled in the art that such degree of asperity of the first and second well layers can be adjusted by controlling the growth condition such as the growth speed and the growth temperature. The degree of asperity may be controlled by any other growth condition than the above-mentioned.

Where the second well layer has a greater degree of asperity than that of the first well layer, the luminous efficiency is improved. It is not clear for the exact relation how each degree of asperity of the first and second well layers influences the luminous efficiency. But it is understood that such influence to the luminous efficiency by the first well layer emitting shorter wavelength light is different from that by the second well layer emitting longer wavelength light. In other words, the device characteristics is influenced by the In composition ratio, the growth number, the growth order of the first and second well layers of the quantum well structure in conjunction with the degree of asperity of each well layer. Since the degrees of asperity of the first and second well layers give different influence to the luminous efficiency, the optimum degree of asperity of first well layer is different from that of the second well layer.

In addition, where the degree of asperity of the second well layer is greater than that of the first well layer, since the luminous intensity emitted by each well layer is kept constant, the light source having desired color rendering property is easily obtained. This comes principally from the good crystallinity as described above. Further where the second well layer has some degree of asperity, more light emitted by the first well layer can come through the second well layer, and the first well layer produces more light (stronger luminous intensity). The second well layer also shows the similar tendency even to less extent though. As explained above, the degree of asperity and the relation thereof cooperatively improve the total luminous efficiency of the device so that the light source having desired color rendering property is easily obtained.

The light emitting device according to another aspect of the present invention, is characterized in that each of the second well layers has dished portions having thickness less than a half of an average thickness thereof, and an area of the dished portions is not less than 10% thereof.

Now referring to FIG. 6, an example of steps for the measuring the ratio of the area of the dished portions over the total surface of the well layer 108, 109. A first step is cutting down the light emitting device in the direction perpendicular to the layer thickness, and observing the cross section of the well layer through a scanning electron microscope or the like. The well layer includes dished portions D having thickness less than a half of an average thickness thereof. The total length S of the dished portions D are counted over a certain region (length L). Then the degree R of the area S of the dished portions over the total surface L is calculated by the expression of R=S/L. Thus the degree R is defined as a ratio of the dished portions occupied in the total surface. Although it is sufficient that the total surface L to be measured is about 1 μm, preferably it is more than about 10 μm, then the degree R can be measured repeatedly correctly. The average thickness of the well layer across the total surface may be measured by measuring the average thickness over the certain region L of the well layer. Further since the degree R of the well layer across the total surface is, in general, to be constant within the device, the R can be measured at any cross section.

In other words, the light emitting device according to this aspect of the present invention is characterized in that the second well layers has the degree R not less than 0.1. Where the degree R of the second well layer is less than 0.1, that is to say, where the second well layer has a relatively flat surface, then light emitted by the first well layer is reduced in comparison with light emitted by the second well layer, and the total luminous efficiency of the light emitting device is also reduced.

Where a plurality of the second well layers are deposited, at least one of the second well layers satisfying the above condition R≧0.1 leads the improvement of the luminous efficiency of the first well layer, but preferably all of the second well layers satisfy the above condition.

Where the degree R of the second well layer is over than 0.5, the p-type semiconductor layer formed on the second well layer loses the flatness so that the luminous efficiency is reduced. Therefore if the degree R of the dished portions occupied in the surface of the second well layer has an upper limit of 0.5, light emitted by the first well layer efficiently comes through the device so that the luminous characteristics of the light emitting device is maintained satisfactory.

The light emitting device according to another aspect of the present invention, is characterized in that the second well layer having the degree of asperity greater than that of the first well layer, or having the degree R not less than 0.1 is disposed between the first well layer and the p-type semiconductor layer.

As described above, in case of that the second well layer having a higher In composition ratio and relatively worse crystallinity is disposed more adjacent to the p-type semiconductor layer (where the hole-electron recombination possibility is higher), advantageously the luminous efficiency can be improved.

Where the first well layer 108 has the degree of asperity greater than that of the second well layer, the light emitted by each device in a wafer shows a great diversity in wavelength. Such great diversity in wavelength among devices makes difficult to repeatedly and reliably manufacturing the light emitting devices having a desired color rendering property. Thus it is preferable also in view of this point to deposit the second well layer between the first well layer and the p-type semiconductor layer.

The light emitting device according to another aspect of the present invention, is characterized in that the growth number of said first well layer is more than that of said second well layer.

Especially where the second well layer is disposed between the first well layer and the p-type semiconductor layer, light emitted by the first well layer is absorbed in the second well layer so that its luminous intensity of the first well layer is reduced. Therefore the light emitting device with desired color rendering property can be easily obtained by depositing the first well layers more times than the second well layer. Also where the growth number of the second well layers that has relatively worse crystallinity is fewer, advantageously the p-type semiconductor layer can be formed subsequently on the second well layer.

The light emitting device according to another aspect of the present invention, is characterized in that the active layer further including, a first barrier layer made of nitride compound semiconductor containing Al, the second barrier layer grown on each of the first and second well layers, a second barrier layer made of nitride compound semiconductor substantially not containing Al, the second barrier layer grown on said first barrier layer.

The active layer further comprises the first and second barrier layer so that the light emitting device has the forward voltage which is dramatically reduced in comparison with the conventional one. That is to say, the Vf is reduced from 3.5V to 3.0V according to the present invention. In conjunction with the reduced Vf, the light emitting device is also improved in the luminous intensity and the luminous efficiency.

Further scope of applicability of the present invention will become apparent from the detailed description given hereinafter. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention become more fully understood from the detailed description given hereinafter and accompanying drawings which are given by way of illustration only, and thus are not limitative of the present invention and wherein.

FIG. 8 is a schematic sectional view of the light emitting device according to Example 11 of Embodiment 3.

DETAILED DESCRIPTION OF THE PREFERRED EMBODIMENTS

Embodiment 1

The light emitting device of Embodiment 1 is designed to emit white light by mixing light emitted by at least two well layers made of nitride compound semiconductor having different In composition ratio. Especially the light emitting device with the desired color rendering property and the high luminous efficiency can be provided by depositing the second well layer emitting longer wavelength light between the p-type semiconductor layer and the first well layer emitting shorter wavelength light.

The well layer made of nitride compound semiconductor containing In emits light having shorter wavelength approximately proportional to bandgap dependent upon the In composition ratio. However as the In composition ratio is greater, then its crystallinity is deteriorated and also its luminous efficiency is reduced. Therefore the second well layer has worse luminous efficiency than the first well layer. And in the active layer of the multiple quantum well structure, the well layer adjacent to the p-type semiconductor layer has the hole-electron recombination possibility greater than that of the well layer adjacent to the n-type semiconductor layer.

According to Embodiment 1 of the present invention, the second well layer having the greater In composition ratio and worse crystallinity is deposited closer to the p-type semiconductor layer than the first well layer having the less In composition ratio and better crystallinity. That is, the second well layer is deposited between the p-type semiconductor layer and the first well layer. Thus the light emitting device having higher luminous intensity and higher luminous efficiency can be formed.

EXAMPLE 1

Figure 1:
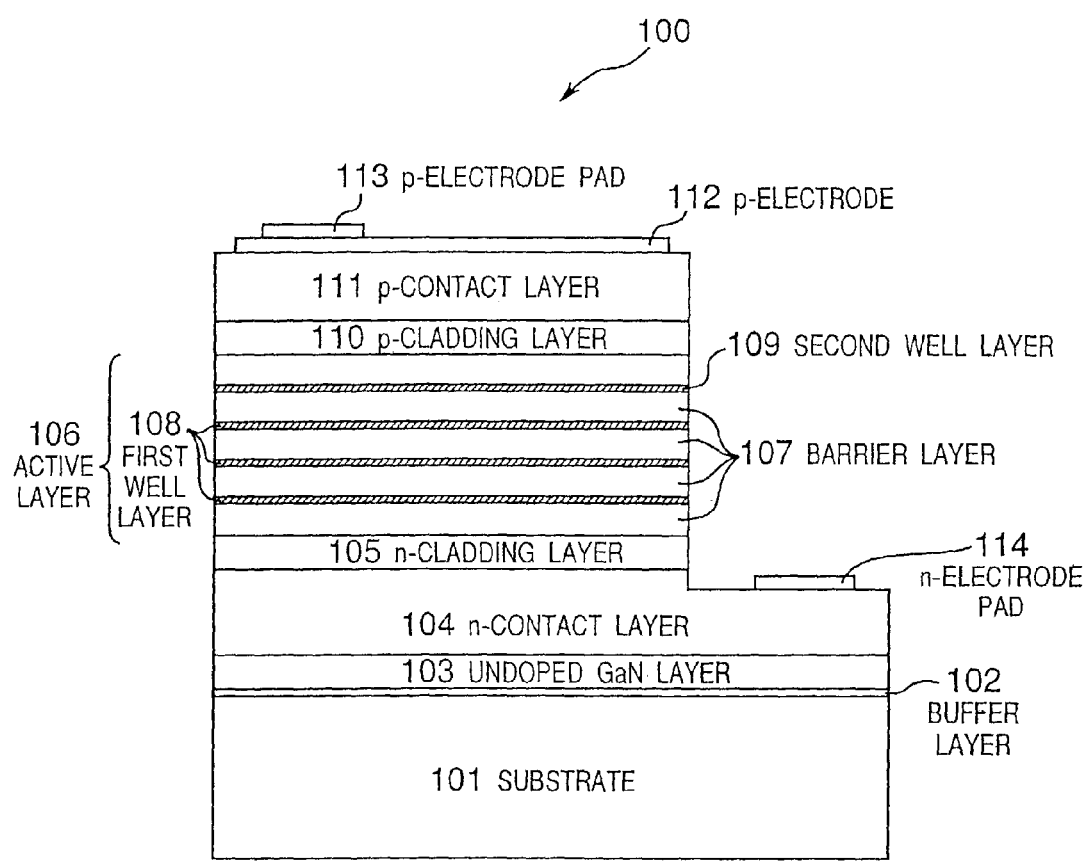
FIG. 1 is a schematic sectional view of the light emitting device according to Example 1 of Embodiment 1.
Figure 2:
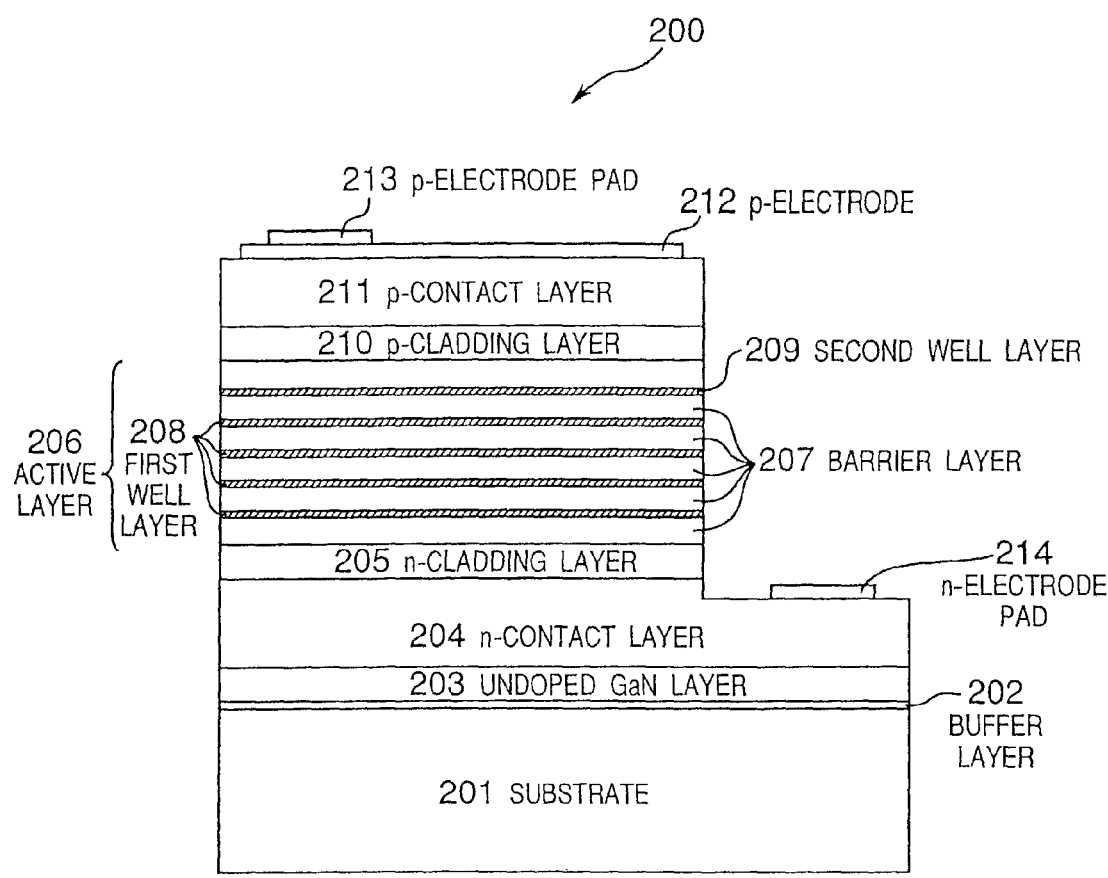
FIG. 2 is a schematic sectional view of the light emitting device according to Example 2 of Embodiment 1.

With reference to FIG. 1, the light emitting device of the present invention is explained hereinafter.

FIG. 1 is a schematic cross sectional view of the light emitting device 100 of the present invention. The light emitting device 100 comprises a substrate 101 of sapphire, a buffer layer 102 of GaN, an undoped GaN layer 103, an n-contact or n-cladding layer 104 of GaN doped with Si, a super lattice layer 105, an active layer 106 of multiple quantum well structure, a p-cladding layer 110 of AlGaN doped with Mg, and a p-contact layer 111 of GaN doped with Mg, those layers are subsequently grown. The active layer 106 includes barrier layers 107, a first well layer 108 of GaN, and a second well layer 109 closer to the p-type semiconductor layer. The second well layer 109 has the In composition ratio greater than that of the first well layer 108. A p-electrode 113 and an n-electrode 114 are formed over the p-contact layer 111 and an n-contact layer 104, respectively to complete the light emitting device 100 capable of emitting the mixed light.

Next a process for producing the light emitting device 100 is described hereinafter.

The light emitting device 100 is grown by MOCVD method. Firstly a washed substrate of sapphire (C-face) having a diameter of two inches is set within a reactor. Then the reactor is vacuated with $H_2$ flow until the reactor is sufficiently substituted with $H_2$ gas. And the temperature of the substrate is set to 1050° C., the substrate 101 is cleaned. The substrate 101 may be employed in the form of an insulative substrate such as sapphire having its principal surface represented by a C-, R- or A-face or spinel ($MgAl_2O_4$), or semiconductor of SiC (including 6H, 4H or 3C), Si, ZnO, GaAs, GaN, or the like.

Subsequently, the growth temperature is decreased to 510° C. and a buffer layer 102 made of GaN which has thickness of about 150 angstroms is grown on the substrate 101 flowing $H_2$ as a carrier gas, and $NH_3$ and TMG (trimethylgallium) as material gases into the reactor. The buffer layer 102 may be formed with material such as AlN and GaAlN besides GaN.

Next, such material gas is held, but the carrier gas is kept flown, and the substrate temperature is set to 1050° C. After the temperature is stable, again the material gas of TMG and $NH_3$ and the carrier gas of $H_2$ are flown into the reactor to grow the undoped GaN layer having thickness of 1.5 µm on the buffer layer 102.

While the growth temperature is kept to 1050° C., the material gas of TMG and $NH_3$, the carrier gas of $H_2$, an impurity gas of $SiH_4$ are flown into the reactor to grow the n-contact layer 104 of GaN doped with Si having the Si impurity concentration of $5 \times 10^{18}/cm^3$ and thickness of 2.25 µm on the undoped GaN layer 103.

And the super lattice layer 105 is preferably grown on the n-contact layer 104 to improve the crystallinity of the active layer 106 and to make the active layer 106 emitting light evenly from the total surface. Maintaining the growth temperature of 1050° C., an undoped GaN layer (not shown) having thickness of 75 angstroms and a Si-doped GaN layer (not shown) having 25 angstroms by controlling the flow of the impurity gas of $SiH_4$. Such undoped GaN layer and Si-doped GaN layer are alternately grown twenty-five cycles to form the super lattice layer 105 having thickness of 2500 angstroms on the n-contact layer 104. It is noted that the Si-doped GaN layers has different Si-impurity concentrations from each other, that means, the super lattice layer 105 is, so-called, modulation-doped.

Next the active layer 106 of multiple quantum well structure will be described hereinafter.

In order to grow the active layer 106 of multiple quantum well structure, the barrier layer 107 of GaN having thickness of 250 angstroms and the first well layer 108 of InGaN having thickness of 30 angstroms are alternately laminated three cycles. And an another barrier layer 107 of GaN having thickness of 250 angstroms and the second well layer 108 of InGaN having thickness of 30 angstroms are formed thereon. The first well layer 108 adjacent to then-cladding layer 105 emits blue light and the second well layer 109 adjacent to the p-cladding layer 110 emits yellow light. And preferably the both of well layers have outermost layers are made of GaN.

The growth steps for the active layer 106 of multiple quantum well structure will be further explained herein.

The barrier layer 107 having thickness of 250 angstroms is grown on the super lattice layer 105 by MOCVD method, with flowing $H_2$ as a carrier gas, and $NH_3$ and TMG as material gases into the reactor at the growth temperature of 1050° C.

After the material gas is held and the growth temperature is set to 800° C., the material gas of TMG, TMI (trimethylinndium) and $NH_3$, the carrier gas of $N_2$, are flown into the reactor to laminate the first well layer of $In_{0.5}Ga_{0.5}N$ having thickness of 30 angstroms.

Then the growth temperature is set to 1050° C., the material gas of TMG and $NH_3$, the carrier gas of $H_2$, are flown into the reactor to laminate the barrier layer 107 of GaN on the first well layer 108. The first well layer 107 and the barrier layer 108 are alternately laminated three cycles.

Next the material gas is held and the growth temperature is set to 800° C., the material gas of TMG, TMI and $NH_3$, the carrier gas of $N_2$, are flown into the reactor to laminate the second well layer of $In_{0.8}Ga_{0.2}N$ having thickness of 30 angstroms. The flow rate of TMI is increased in the case that the second well layer 109 is laminated, in comparison with the case that the first well layer 108 is laminated.

It is noted that the well layers 108 and 109 may be undoped or doped with the acceptor impurity such as Mg and Zn, or with the donor impurity such as Si. Further the well layers 108 and 109 may be doped with both of the acceptor and donor impurity.

After growing the active layer 106, the p-cladding layer 110 having super lattice structure is formed on the active layer 106. An AlGaN layer doped with Mg having thickness of 40 angstroms and an InGaN layer doped with Mg having thickness of 25 angstroms are laminated five cycles to form the p-cladding layer 110. The growth temperature is set to 1050° C., the material gas of TMG, TMA (trimethylaluminum) and $NH_3$, the impurity gas of $Cp_2Mg$ (cyclopentadienyl magnesium), the carrier gas of $H_2$, are flown into the reactor to laminate the AlGaN layer having thickness of 40 angstroms. After the material gas is held, the growth temperature is set to 850° C., again the material gas of TMG, TMI and $NH_3$, the impurity gas of $Cp_2Mg$, the carrier gas of $N_2$, are flown into the reactor to laminate the InGaN layer having thickness of 25 angstroms. The AlGaN layer and InGaN layer are alternately laminated five cycles to form the p-cladding layer 110 of super lattice structure having total thickness of 325 angstroms. It is noted that this example adapts the super lattice structure for the p-cladding layer 110, but a single layered structure may be also utilized.

Next the growth temperature is set to 1050° C., the material gas of TMG and $NH_3$, the impurity gas of $Cp_2Mg$, the carrier gas of $H_2$, are flown into the reactor to grow the p-contact layer 111 having thickness of 0.25 µm on the p-cladding layer 110. After growing the p-contact layer 111, the temperature is cooled down to the room temperature, then the wafer is annealed at 700° C. within the $N_2$ atmosphere to make the p-type layers have less resistivity.

After annealing, the resultant wafer is taken out of the reactor, a desired mask is formed on the top surface of the p-contact layer 111, and the wafer is etched from a side of the p-contact layer 111 to expose surfaces of the n-type and p-type semiconductor layer.

After being etched, a transparent p-electrode 112 containing Ni and Au having thickness of 200 angstroms are formed by spattering on the approximately complete surface of the p-contact layer 111, and a p-electrode pad 113 of Au having thickness of 0.5 µm is formed on the p-electrode 112 capable of being bonded. Meanwhile an n-electrode 114 containing W and Al is formed on the exposed surface by the etching step. Lastly an insulating layer of $SiO_2$ (not shown) is formed as an overcoat film on the p-electrode 112 to protect the surface. Such formed nitride semiconductor device are scribed and broken by force into each LED chip having area of 350 µm square to complete the light emitting device.

As explained above, the light emitting device of the present invention comprises, in general, an active layer 106 of multiple quantum well structure, the active layer 106 includes a first and second well layers 108 and 109, both containing In. The second well layer 109 is formed to emit light having the main wavelength longer than that emitted by the first well layer 108. The active layer 106 of the present invention are made of the nitride semiconductor containing In, such as $In_XAl_YGa_{1-X-Y}N$ wherein $0<X$, $0 \leq Y$, $X+Y \leq 1$), and more preferably $In_XGa_{1-X}N$, wherein $0<X<1$). This is because the active layer of InGaN can be formed with better crystallinity in comparison with the InGaAlN layer, even where they have dished portions or asperity on their surfaces. The active layer 106 of the light emitting device 100 further comprises barrier layers 107 of nitride semiconductor having bandgap greater than that of the first and second well layers 108, 109. And the active layer 106 are formed by laminating the first and second well layers 108, 109 and the barrier layer 107 interposed therein.

Although not specifically limited thereto, the barrier layer is formed of GaN, InGaN, AlGaN, or the like, with thickness thicker than the first and second well layers 108, 109, that is, for instance, of several hundred angstroms. And the first and second well layers 108, 109 is adjusted, not specifically limited thereto but preferably, to have thickness not greater than 100 angstroms, more preferably not greater than 70 angstroms, and most preferably not greater than 50 angstroms. Where the thickness of the well layers is thicker than 100 angstroms, such thickness is more than a critical elastic thickness that often causes minor cracks and crystal defects within the well layers.

The p-type and n-type semiconductor layers are used, not specifically limited thereto, with material such as nitride semiconductor having a p-type and n-type conductivity. The material composition of the present invention is expressed as $In_XAl_YGa_{1-X-Y}N$, wherein $0<X$, $0 \leq Y$, $X+Y \leq 1$, and such material are doped with p-type or n-type impurity to have the p-type or n-type conductivity.

LED (Light Emitting Diode) lamps (not shown) are produced by incorporating the resultant light emitting device. The leads made of copper containing iron are silver coated thereon, and include a mount-lead having a cup receiving the LED chip and an inner-lead electrically connecting to one of the electrode of the LED chip through an Au wire. The LED chip is die-bonded on the cup of the mount-lead with epoxy resign, then two Au wires having diameter of 35 µm are ball-bonded on the p-electrode 113 and the n-electrode 114 at one end, and stich-bonded on each lead. Thus both electrodes 113, 114 of the LED chip are electrically connected to the mount-lead and the inner-lead.

Figure 3:
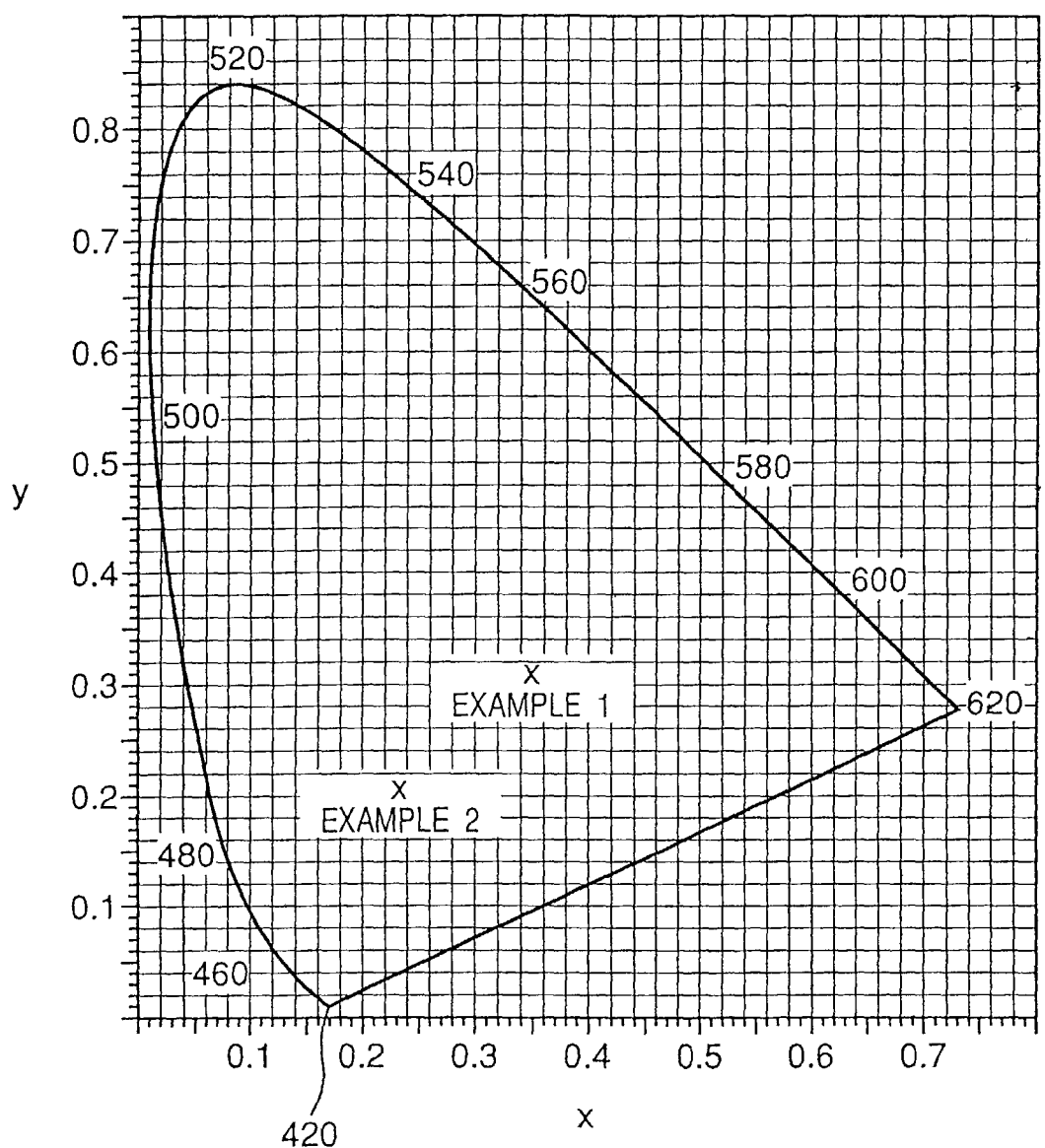
FIG. 3 is a CIE chromaticity diagram showing the coordinates of light emitted by the light emitting devices according to Example 1 and Example 2.

A forward current of 20 mA is applied to the LED lamp (Vf=3.5V), then white light with spectrum which has a coordinate in the CIE chromaticity diagram as $(X, Y)= (0.333, 0.314)$ as shown in FIG. 3 and its color temperature of 6000K. Light emitted by the first and second well layers are observed to have main wavelength of about 470 nm and about 575 nm, respectively. The spectrum distribution of light emitted by the second well layer 109 has broader half-width than that by the first well layer 108, which contributes the lamp in improving the color rendering property. It is noted that more than two kinds of well layers (the first and second well layers) that emit different wavelength light can be also utilized so that the spectrum of the LED lamp is much broader to further improve the color rendering property.

In order to confirm the effect of the present invention, an another light emitting device 100 is formed as the same way of Example 1 except that the second well layer 109 is laminated adjacent to the n-cladding layer 105 firstly and then first well layer 108 is disposed over the second well layer 109. Such formed LED lamp emits light having luminous intensity much less than that of Example 1 and bluish white color. This is understood because light emitted by the second well layer 109 is reduced and light emitted by the first well layer 108 is also reduced due to the crystallinity deteriorated by the worse crystallinty of the second well layer 109 that has the higher In composition ratio.

EXAMPLE 2

An another light emitting device 200 of this Example 2 is formed as the same way of Example 1 except that an another first well layer is added, that is, the device 200 has four first well layers instead of three. Such formed light emitting device 200 emits light having the color temperature higher than that of the device of Example 1 and bluish white color. Similarly an another light emitting device is formed as the same way of Example 1 except two another first well layers are added, that is, the device has five first well layers. Such formed light emitting device emits light having more bluish white color. FIG. 3 shows the coordinates in the CIE chromaticity diagram of light emitted by the light emitting device 100 (including three first well layers and one second well layer) of Example 1, and by the light emitting device 200 (including four first well layers and one second well layer) of Example 2. Thus the ratio of the growth numbers of the first and second well layers can be adjusted to obtain the mixed light having the desired coordinate in the CIE chromaticity diagram and the color temperature.

EXAMPLE 3

An another light emitting device of this Example 3 is formed as the same way of Example 1 except that the barrier layer 107 sandwiching the first well layer 108 is formed such that they have thickness of approximately 300 angstroms instead of 250 angstroms. When the forward current is applied to the light emitting device 100, light emitted by the first well layer 108 alone becomes stronger while light emitted by the second well layer 109 has the almost same luminous intensity.

EXAMPLE 4

An another light emitting device of this Example 4 is formed as the same way of Example 1 except that the barrier layer 107 sandwiching the second well layer 109 is formed such that they have thickness of approximately 200 angstroms instead of 250 angstroms. When the forward current is applied to the light emitting device 100, light emitted by the second well layer 109 becomes weaker while light emitted by the first well layer 108 alone has the almost same luminous intensity.

Therefore according to Examples 3 and 4, the light source can be easily completed with the desired color rendering property by adjusting thickness of the barrier layers 107 to control the ratio of luminous intensity emitted by each well layers.

EXAMPLE 5

Figure 4:
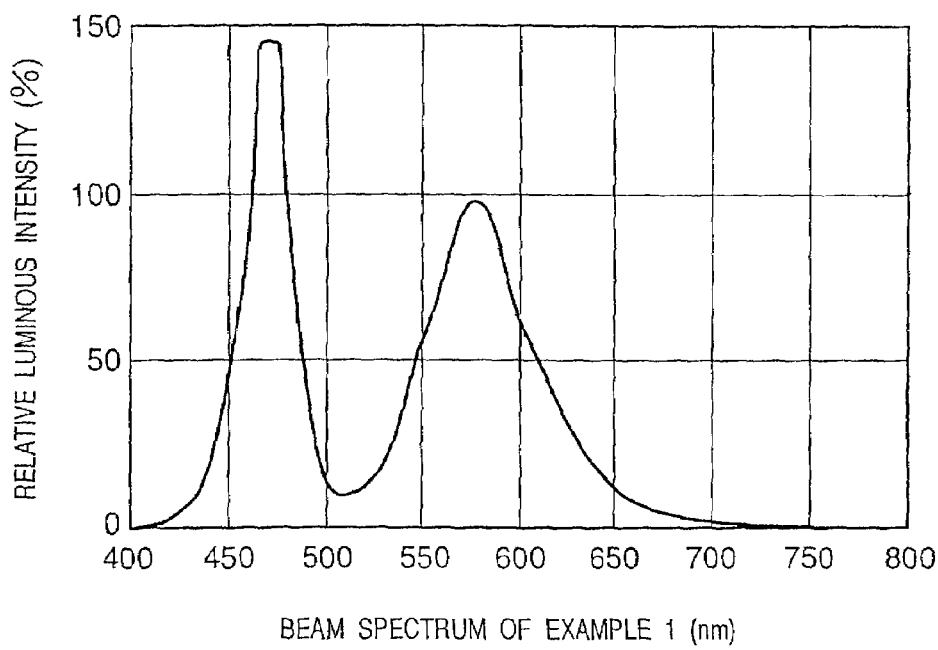
FIG. 4 is a spectrum distribution diagram of light emitted by the light emitting device according to Example 1 of Embodiment 1.
Figure 5:
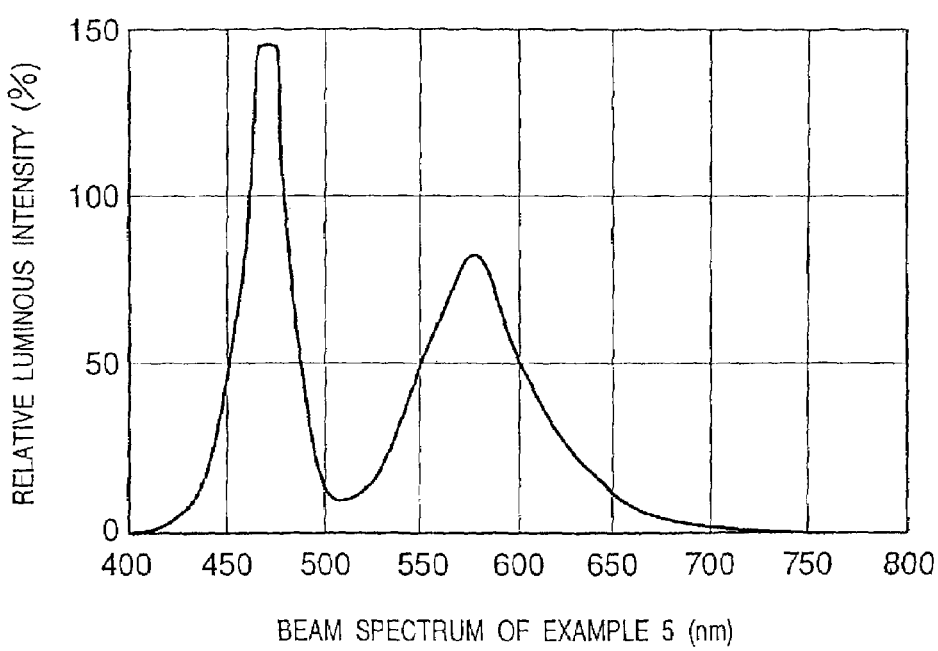
FIG. 5 is a spectrum distribution diagram of light emitted by the light emitting device according to Example 5 of Embodiment 1.

An another light emitting device of this Example 5 is formed as the same way of Example 1 except that the second well layer 109 is formed such that its light spectrum has a half-width wider than that of the first well layer 108. In the manufacturing process, the second well layer 109 is grown at the growth temperature of 810° C. instead of 800° C., and with flow of TMI (material gas) more than that used in Example 1. In general, in case where the growth temperature is higher then its main peak wavelength shifts to shorter side, on the contrary, in case where the flow of In material gas is increased more then its main peak wavelength shifts to longer side. And in both cases, light emitted by the second well layer 109 has broader spectrum, that is, the half-width of the second well layer 109 is wider. As indicated, if the flow of TMI can be decreased to keep the main peak wavelength shifted by the higher growth temperature (800° C. to 810° C.), light emitted by the second well layer 109 has the wider half-width without changing its main wavelength. FIGS. 4 and 5 show the spectrum distribution diagram of light emitted by the second well layer 109 according to Example 1 and Example 2, respectively.

Therefore the light spectrum can be widen by the higher growth temperature, as explained above, or by alternative ways such as, having the active layer thicker, adding impurity therein, or combining the above-mentioned ways.

Embodiment 2

According to Embodiment 2, the second well layer 109 is formed such that its degree of asperity is greater than that of the first well layer 108, or such that an area of the dished portions having thickness less than a half of an average thickness thereof is not less than 10%, so that the light emitting device having the high luminous efficiency and desired color rendering property can be obtained.

One example method for evaluating the degree of asperity will be discussed hereinafter.

Figure 6:
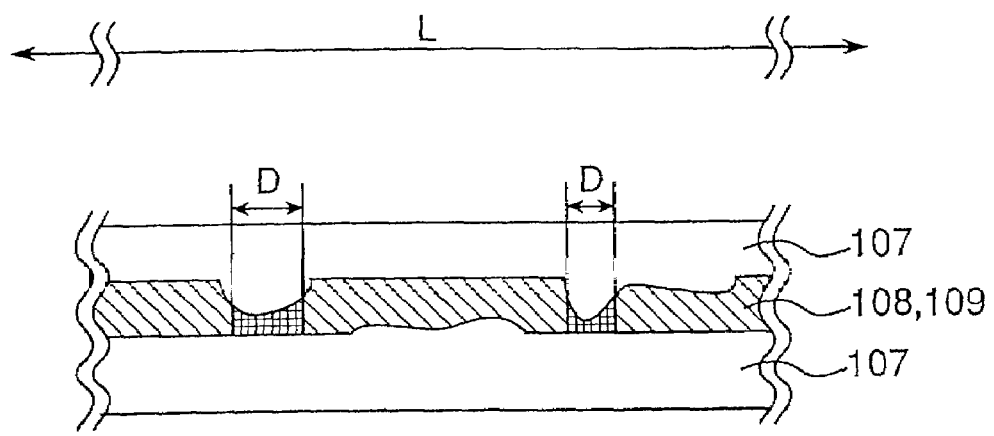
FIG. 6 is a schematic sectional view of the light emitting device according to Embodiment 2 of the present invention.
Figure 7:
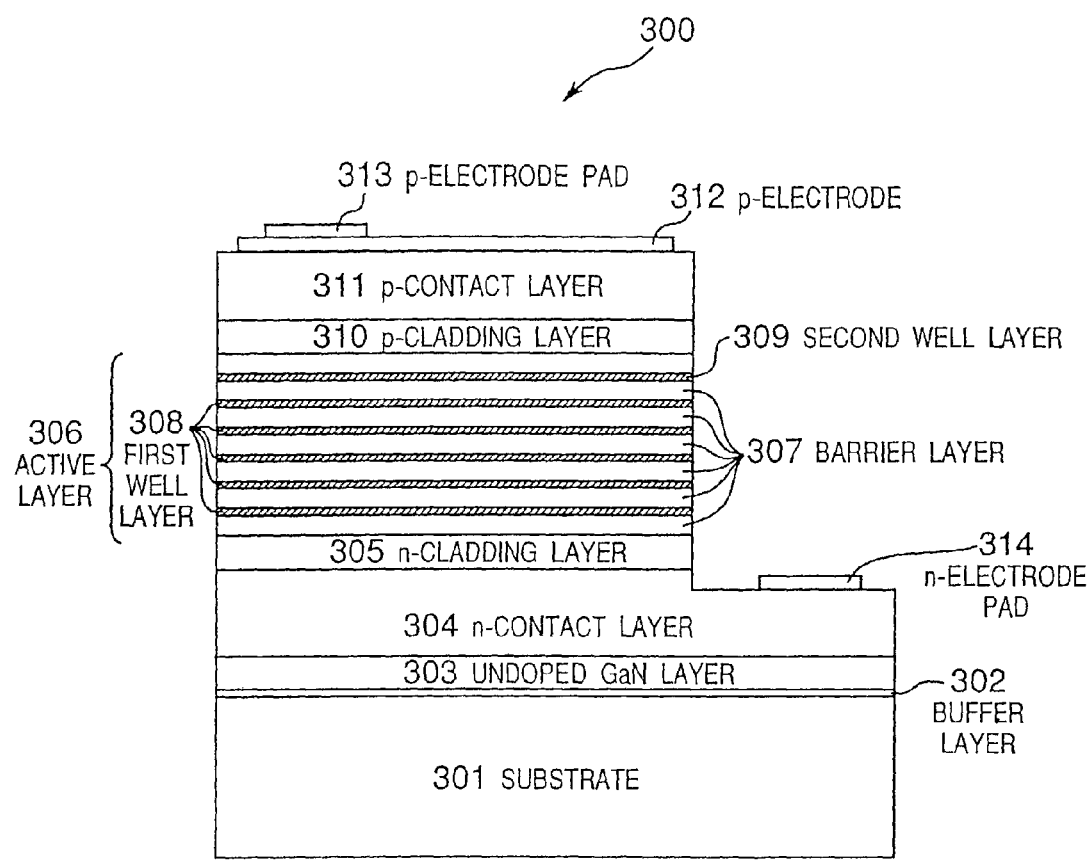
FIG. 7 is a schematic sectional view of the light emitting device according to Example 8 of Embodiment 2.

As shown in FIG. 6, firstly the light emitting device 100 formed in Embodiment 1 is cut down in the direction perpendicular to the layer thickness, and the cross section of the first and second well layers 108, 109 are observed through a scanning electron microscope or the like. The first and second well layers 108, 109 include dished portions D having thickness less than a half of an average thickness thereof. The total length S of the dished portions D is counted over a certain region (length L). Then the degree R of the area S of the dished portions over the total surface L is calculated by the expression of R=S/L. Thus the degree R is defined as a ratio of the dished portions occupied in the total surface. Although it is sufficient that the total surface L to be measured is 1 μm, preferably it is more than about 10 μm, the degree R can be measured repeatedly correctly. The average thickness of the well layer across the total surface may be measured by measuring the average thickness over the certain region L of the well layer. Further since the degree R of the well layer across the total surface is, in general, to be constant within the device, the degree R can be measured at any cross section.

In fact, the degree R of the second well layer 109 of the Embodiment 1 is measured as 0.15.

EXAMPLE 6

When the growth temperature is a little increased and the second well layer 108 is formed, the second well layer 109 is obtained such that its degree R of asperity is 0.2. In other words, an another light emitting device of this Example 6 is formed as the same way of Example 1 except that the second well layer 109 is formed such that its degree R of asperity is 0.2. The light emitting device of Example 6 has a luminous ratio of the blue light emitted by the first well layer 108 over the yellow light emitted by the second well layer 109, which is a little greater than that of Example 1. And the luminous efficiency of the light emitting device 100 is almost same as one of Example 1.

EXAMPLE 7

The growth temperature of the first well layer 108 emitting blue light is changed, then another light emitting device is formed as the same way of Example 1. In general, the well layers have tendency to have the degree R of asperity greater as the growth temperature is higher. After the growth temperature is set to 830° C., the material gas of TMG, TMI, and $NH_3$, and the carrier gas of $N_2$, are flown at a growth speed of 2 angstroms per second to form a layer of $In_{0.5}Ga_{0.5}N$ having thickness of 30 angstroms. The first well layer 109 is totally laminated three times as Example 1.

Such formed first well layer 108 has some asperity as well as the second well layer 109 does, and the degree R of asperity of the first well layer 108 is 0.1. This light emitting device 100 shows a good luminous efficiency almost same as one of Example 1. More preferably, there is very little diversity in the luminous ratio of the first and second well layer 108, 109 among the devices (chips) from a wafer. Therefore the light emitting devices 100 emitting white light with the desired color rendering property can be manufactured repeatedly.

EXAMPLE 8

An another light emitting device 300 of this Example 8 is formed as the same way of Example 7 except that two more first well layers 308 are added to the device 100 (five first well layers in total). The second well layer 309 has asperity greater than that of the first well layers 308. The light emitting device 300 emits light more bluish than that of the device 200 according to Example 2, which has four first well layers 208. The light emitting device 300 of this Example 8 has the luminous efficiency greater than that of the device of Example 2. Light emitted by each well layer, especially by the first well layer 308 is also increased. In addition, the luminous intensity ratio of the first and second well layers 308, 309 are kept constant and stable so that the light emitting device 300 emitting white light with the desired color rendering property can be produced repeatedly.

EXAMPLE 9

In contrast with Example 8, an another light emitting device 300 of this Example 9 is formed such that the degree R of asperity of its first well layer 308 is greater than that of the second well layer 309. Thus the light emitting device 300 has the active layer 306, in which the degree R of asperity of the first and second well layers 308, 309 is 0.2 and 0.4, respectively.

The light emitting device 300 has the luminous efficiency much less than that of the device of Example 8 and less than that of the device of even Example 1. To be less preferably, the luminous intensity ratio of the first and second well layers 308, 309 has greater diversity among the devices so that it is almost impossible to repeatedly manufacture the light emitting devices emitting white light with the desired color rendering property.

EXAMPLE 10

As similar to Example 8, an another light emitting device is formed such that the first and second well layers 308, 309 have the degree R of dished portions occupying over the total area of 0.05, 0.08, respectively. Measuring each thickness of the first well layers 308 shows that the degree R of each first well layers 308 is almost identical to about 0.05.

In practical, the degree R is not always precisely measured since the asperity of the first well layers can be easily distinguished as less than that of the second well layers 309 by just observing the cross section of the active layer 306.

Such formed light emitting device 300 emits light having the luminous efficiency that is good but a little less than that of Example 8, and the color rendering property that is satisfactory. Therefore it is understood that the relation of the degree of the first and second well layer 308, 309 gives more impact to the characteristics of the light emitting device 300, rather than the degree itself of the first and second well layer 308, 309.

Embodiment 3

According to Embodiment 3, the light emitting device further comprises a first barrier layer made of material as expressed in the formula of $Al_ZGa_{1-Z}N$ (0<Z<1) and a second barrier layer made of GaN so that the forward voltage Vf is reduced and the luminous intensity is improved.

EXAMPLE 11

With reference to FIG. 8, Example 11 will be described hereinafter.

Using the same reactor, another light emitting device 400 according to Embodiment 3 of the present invention is formed. The light emitting device 400 comprises, in general, an active layer 401, a p-type and n-type semiconductor layers 402, 403 sandwiching the active layer 401.

The n-type semiconductor layers 402 comprises a substrate 411 of sapphire, a buffer layer 412 of GaN, an n-contact layer 413 formed by being alternately laminated five times with an undoped GaN layer 413a and a Si-doped layer 413b, and an n-cladding layer 414 of InGaN doped with Si. And an n-electrode 436 is formed on the uppermost Si-doped layer 413b of the n-contact layer 413.

The p-type semiconductor layers 403 comprises a first p-cladding layer 431 of InGaN doped with Mg, a second p-cladding layer 432 of AlGaN doped with Mg, and a p-contact layer 433 of GaN doped with Mg, those layers are subsequently grown on the active layer 401.

The active layer 401 is formed of multiple quantum well structure laminating at least one of first well layers 416 of InGaN adjacent to the n-contact layer 414, and at least one of second well layers 420 of InGaN adjacent to the p-contact layer 433. The second well layer 420 has the In composition ratio greater than that of the first well layer 416. And the light emitting device 400 according to Embodiment 3, in particular, includes a first barrier layer 417 of AlGaN on each of the first well layers 416 and a second barrier layer 418 of GaN formed on each of the first barrier layer 417. Similarly the first and second barrier layer 421, 422 are formed on the second well layer 420. The first barrier layer 417, 421 acts as mostly to stop the electrons and the second barrier layer 418, 422 function mostly as a bed layer for the subsequent formed well layer. Thus a plurality of barrier layers having different composition are formed on the well layer so that the crystallinity of the active layer 401 is improved and the forward voltage of the device 400 is reduced. Such first and second, barrier layers 417, 418, 421, 422 are effective where the active layer is made of single quantum well structure, or of multiple quantum well structure including well layers having substantially same In composition ratio. Thus the light emitting device can be provided, which has improved crystallinity, the low forward voltage, and the high luminous intensity.

As well known, the well layer emitting light having the main peak wavelength longer than the yellow region can be hardly laminated with good crystallinity. Therefore especially where the light emitting device is formed to emit white light by mixing the blue and yellow colors of light emitted by the first well layer 416 and by the second well layer 420, those first and second barrier layers provide substantial effects with the device. It is noted that more particularly where the first barrier layer 417, 421 has the Al composition ratio not less than 0.3, its crystallinity is much improved. In this Example 11, the Al composition ratio of the first barrier layer 417, 421 is set to 0.5.

The active layer of Example 11 comprises the first well layer 416, the first barrier layer 417, and the second barrier layer 418, those layers laminated subsequently and four cycles, and further comprises the second well layer 420, the first barrier layer 421, and the second barrier layer 422, those layers laminated subsequently. The first and second well layers 416, 420 are made of InGaN, which emits light with desirable wavelength by adjusting the In composition ratio. For example, the In composition ratio may be adjusted such that the first well layer 416 emits blue light having main peak wavelength of 480 nm and the second well layer 420 emits yellow light having main peak wavelength of 580 nm. The first and second well layers 416, 420 and the first barrier layers 417, 421 may have thickness of about 30 angstroms, and the second barrier layers 418, 422 may have thickness of about 300 angstroms.

Next a process for producing the light emitting device 400 is described hereinafter.

The light emitting device 400 is grown by MOCVD method. Firstly a washed substrate of sapphire (C-face) having a diameter of two inches is set within a reactor. Then the reactor is vacuated with $H_2$ flow until the reactor is sufficiently substituted with $H_2$ gas. And the temperature of the substrate is set to 1050° C., the substrate 411 is cleaned. The substrate 411 may be employed in the form of an insulative substrate such as a sapphire substrate having its principal surface represented by a C-, R- or A-face or spinel ($MgAl_2O_4$), or a semiconductor substrate made of such as SiC (including 6H, 4H or 3C), Si, ZnO, GaAs, and GaN.

Subsequently, the growth temperature is decreased to 510° C. and a buffer layer 412 made of GaN which has a thickness of about 150 angstroms is grown on the substrate 411 flowing $H_2$ as a carrier gas, and $NH_3$ and TMG as material gases into the reactor. The buffer layer 412 may be formed with material such as AlN and GaAlN besides GaN.

Next, such material gas is held, but the carrier gas is kept flown, and the substrate temperature is set to 1050° C. After the temperature is stable, again the material gas of TMG and $NH_3$ and the carrier gas of $H_2$ are flown into the reactor to grow an undoped GaN layer 413a on the buffer layer 412. And maintaining the growth temperature, the material gas of TMG and $NH_3$, the carrier gas of $H_2$, and an impurity gas of $SiH_4$ are flown into the reactor to grow a Si-doped GaN layer 413b on the undoped GaN layer 413a. The Si-doped GaN layer 413a and the undoped GaN layer 413b are formed alternately five cycles to form an n-contact layer 413 having thickness of 4 μm.

Next the material gas is held, and the growth temperature is set to 800° C. After the temperature is stable, the material gas of TMG, TMI, and $NH_3$, the carrier gas of $H_2$, and an impurity gas of $SiH_4$ are flown into the reactor to grow an n-cladding layer 414 of Si-doped InGaN on the Si-doped GaN layer 413b.

Next the active layer 401 of multiple quantum well structure is grown by MOCVD method on the n-cladding layer 414 of Si-doped InGaN. While the growth temperature is set to 1050° C., the material gas of TMG and NH$_3$, the carrier gas of H$_2$, the impurity gas of SiH$_4$ are flown into the reactor to grow an n-type GaN layer 415 having thickness of 200 angstroms on the n-cladding layer 414.

Then the material gas is held, and the growth temperature is set to 750° C. Again the material gas of TMG, TMI, and NH$_3$, and the carrier gas of N$_2$ are flown into the reactor to laminate a first well layer 416 of InGaN having thickness of 30 angstroms.

Next the material gas of TMG, TMA, and NH$_3$, and the carrier gas of H$_2$ are flown into the reactor to laminate a first barrier layer 417 of AlGaN having thickness of 30 angstroms.

Then the material gas is held, while the carrier gas is flown, and the growth temperature is set to 1000° C. The material gas of TMG and NH$_3$ and the carrier gas of H$_2$ are flown into the reactor to laminate a second barrier layer 418 of GaN having thickness of 300 angstroms.

Similarly the first well layer 416, the first barrier layer 417, and the second barrier layer 418 are subsequently grown four cycles.

Next similarly a second well layer 420 is laminated thereon one time only, while the first well layer 416 are laminated four times in total. The same layer structure of the first and second well layer 416, 422 are formed on the second well layer 420 except the In composition ratio within each well layer.

After forming the active layer 401, a first p-cladding layer 431 of InGaN is grown thereon by the MOCVD method. The first p-cladding layer 431 is made of Mg-doped InGaN having thickness of 200 angstroms. The growth temperature is set to 1050° C., the material gas of TMG, TMI, and NH$_3$, the carrier gas of H$_2$, and the impurity gas of Cp$_2$Mg are flown into the reactor to grow the first p-cladding layer 431 of InGaN.

After forming the first p-cladding layer 431, a second p-cladding layer 432 of AlGaN is grown thereon. The second p-cladding layer 432 is made of Mg-doped AlGaN having thickness of 200 angstroms. The growth temperature is set to 1050° C., the material gas of TMG, TMA, and NH$_3$, the carrier gas of H$_2$, and the impurity gas of Cp$_2$Mg are flown into the reactor to grow the second p-cladding layer 432 of AlGaN.

Next the growth temperature is maintained to 1050° C., the material gas of TMG and NH$_3$, the carrier gas of H$_2$, and the impurity gas of Cp$_2$Mg are flown into the reactor to grow the p-contact layer 433 of GaN having thickness of 3000 angstroms on the second p-cladding layer 432. After forming the p-contact layer 433, the temperature is cooled down to the room temperature, then the wafer is annealed at 700° C. within the N$_2$ atmosphere to make the p-type layers have less resistivity.

After annealing, the resultant wafer is taken out of the reactor, a desired mask is formed on the top surface of the p-contact layer 433, and the wafer is etched from a side of the p-contact layer 433 to expose the n-type and p-type semiconductor surfaces.

After being etched, a transparent p-electrode 434 containing Ni and Au having thickness of 200 angstroms are formed by spattering on the approximately whole surface of the p-contact layer 433, and a p-electrode pad 435 of Au having thickness of 0.5 μm is formed on the p-electrode 434 capable of being bonded. Meanwhile an n-electrode 436 containing W and Al is formed on the etched surface of the n-contact layer 413a. Lastly an insulating layer of SiO$_2$ (not shown) is formed as an overcoat film on the p-electrode 435 to protect the surface. Such formed nitride semiconductor device are scribed and broken by force into each LED chip having 350 μm square to complete the light emitting device.

LED (Light Emitting Diode) lamps (not shown) are produced by incorporating the resultant light emitting device. The leads made of copper containing iron are silver coated thereon, and include a mount-lead having a cup receiving the LED chip and an inner-lead electrically connecting to one of the electrode of the LED chip through an Au wire. The LED chip is die-bonded on the cup of the mount-lead with epoxy resign, then two Au wires having diameter of 35 μm are ball-bonded on the p-electrode 113 and the n-electrode 114 at one end, and stich-bonded on each lead. Thus both electrodes 113, 114 of the LED chip are electrically connected to the mount-lead and the inner-lead.

When a forward current of 20 mA is applied to the LED lamp, the forward voltage is 3.0V, while the Vf of the conventional LED lamp is 3.5V, that is dramatically reduced. Also such formed LED lamp emits white light much brighter.

As explained above, the light emitting device according to the present invention has a great number of advantages and effects, such as:

The light emitting device comprises a first and second well layer emitting light of different peak wavelength so that the device can produce a mixed light by itself, such as white light having high luminous intensity and high luminous efficiency. More advantageously, its color rendering property can be desirably and easily controlled by adjusting the ratio of the growth numbers of the first and second well layers, and/or the thickness of the barrier layers sandwiching the well layers.

Further its color rendering property can be desirably and easily controlled by forming the second well layer having the degree of asperity greater than that of the first well layer, or having the degree R of area occupied by the dished portions of thickness less than a half of an average thickness over the total surface to be not less than 10%.

Further the forward voltage can be dramatically reduced by substituting the barrier layer of Example 1 by the first and second barrier layer of Example 11. In conjunction with the reduced Vf, the light emitting device is also improved in the luminous intensity and the luminous efficiency.

What is claimed is:

1. A light emitting device comprising:
    an active layer, of a multiple quantum well structure, sandwiched between an n-type semiconductor layer having a super lattice structure and a p-type semiconductor layer;
    said active layer including (a) a plurality of first well layers made of nitride compound semiconductor containing In and each emitting light having a same main peak wavelength, (b) at least one second well layer made of nitride compound semiconductor containing In, said second well layer emitting light having a main peak wavelength which is longer that of said first well layers, and (c) a plurality of barrier layers;
    wherein a number of said first well layers exceeds a number of said at least one second well layer.

2. The light emitting device according to claim 1, wherein said second well layer is disposed between said first well layers and said p-type semiconductor layer.

3. The light emitting device according to claim 1, wherein a light spectrum emitted by each of said first well layers is a half-width narrower than a light spectrum emitted by said second well layer.

4. The light emitting device according to claim 2, wherein a light spectrum emitted by each of said first well layers is half-width narrower than a light spectrum emitted by said second well layer.

5. The light emitting device according to claim 1, wherein the main peak wavelength of each of said first well layers falls within the range of 450 through 500 nm, and the main peak wavelength of said second well layer falls within the range of 560 through 670 nm.

6. The light emitting device comprising:
  an active layer, of a multiple quantum well structure, sandwiched between an n-type semiconductor layer having a super lattice structure and a p-type semiconductor layer;
  said active layer including (a) a plurality of first well layers made of nitride compound semiconductor containing In and each emitting light having a same main peak wavelength, (b) at least one second well layer made of nitride compound semiconductor containing In, said second well layer emitting light having a main peak wavelength which is longer that of said first well layers, and (c) a plurality of barrier layers;
  wherein a number of said first well layers exceeds a number of said at least one second well layer, and
  wherein the luminous intensity emitted by each well layer is adjusted by controlling a thickness of each well layer.

7. The light emitting device according to claim 6, wherein said second well layer is disposed between said first well layers and said p-type semiconductor layer.

8. The light emitting device according to claim 6, wherein a light spectrum emitted by each of said first well layers is a half-width narrower than a light spectrum emitted by said second well layer.

9. The light emitting device according to claim 8, wherein a light spectrum emitted by each of said first well layers is a half-width narrower than a light spectrum emitted by said second well layer.

10. The light emitting device according to claim 6, wherein the main peak wavelength of each of said first well layers falls within the range of 450 through 500 nm, and the main peak wavelength of said second well layer falls within the range of 560 through 670 nm.

11. The light emitting device according to claim 1, wherein said p-type semiconductor layer has a super lattice structure.

12. The light emitting device according to claim 1, wherein two of said barrier layers are positioned at the outermost parts of said active layer and the outermost barrier layers are made of GaN.

13. The light emitting device according to claim 6, wherein said p-type semiconductor layer has a super lattice structure.

14. The light emitting device according to claim 6, wherein two of said barrier layers are positioned at the outermost parts of said active layer and the outermost barrier layers are made of GaN.

* * * * *